United States Patent [19]

Higman et al.

[11] Patent Number: 4,947,111

[45] Date of Patent: Aug. 7, 1990

[54] TEST FIXTURE FOR MULTI-GHZ MICROWAVE INTEGRATED CIRCUITS

[75] Inventors: Roger H. Higman; Gilbert Perkins, both of Palm Bay, Fla.

[73] Assignee: Harris Corporation, Melbourne, Fla.

[21] Appl. No.: 334,147

[22] Filed: Apr. 6, 1989

[51] Int. Cl.$^5$ ............................................. G01R 31/02
[52] U.S. Cl. .............................. 324/158 F; 324/158 P
[58] Field of Search ............ 324/158 F, 158 P, 73 PC, 324/73 AT, 72.5; 333/1, 32; 439/482

[56] References Cited

U.S. PATENT DOCUMENTS

| | | | |
|---|---|---|---|
| 4,321,532 | 3/1982 | Luna | 324/158 F |
| 4,352,061 | 9/1982 | Matrone | 324/158 P |
| 4,357,062 | 11/1982 | Everett | 324/158 F |
| 4,406,373 | 9/1983 | Braden | 324/158 F |
| 4,443,756 | 4/1984 | Lightbody et al. | 324/158 P |
| 4,504,780 | 3/1985 | Marsella | 324/158 P |
| 4,574,236 | 3/1986 | Hechtman | 324/158 F |
| 4,598,456 | 7/1986 | McConnell | 29/407 |
| 4,695,810 | 9/1987 | Heckaman et al. | 333/1 |
| 4,700,132 | 10/1987 | Yarbrough et al. | 324/158 F |
| 4,701,702 | 10/1987 | Krüger | 324/158 P |
| 4,705,081 | 11/1987 | Birk et al. | 140/147 |
| 4,724,377 | 2/1988 | Maelzer et al. | 324/158 F |
| 4,837,507 | 6/1989 | Hechtman | 324/158 P |

Primary Examiner—Reinhard J. Eisenzopf
Assistant Examiner—Vinh P. Nguyen
Attorney, Agent, or Firm—Evenson, Wands, Edwards, Lenahan & McKeown

[57] ABSTRACT

A fixture for testing of an MMIC-containing package includes an alignment plate, a pogo-pin assembly, a waffleline support baseplate, and a pressure engagement assembly. The alignment plate contains a pattern of apertures that matches that of the pins of the MMIC-containing package and defines, with those pins, transmission lines having an impedance that effectively matches that of the internal interconnect to the MMICs within the package. The alignment plate is mounted atop a pogo-pin assembly, pogo-pins of which are aligned with signal conductors of the package, and which form transmission lines having an impedance effectively matching the impedance of the transmission lines through the alignment plate. The pogo-pin assembly engages a waffleline structure in a baseplate. The baseplate includes coaxial connectors that are coupled to channels of the waffleline and joined to the pogo-pins. A pressure engagement assembly is mounted upon the baseplate adjacent to the pogo-pin assembly for urging a MMIC-containing package into pressure contact with the alignment plate. As the package is brought into contact with the alignment plate, its signal conductors are aligned with and pass through the apertures through the plate, and press against the pogo-pins.

24 Claims, 6 Drawing Sheets

TEST FIXTURE FOR MULTI-GHZ MICROWAVE INTEGRATED CIRCUITS

FIELD OF THE INVENTION

The present invention relates in general to the testing of electronic circuit components and is particularly directed to a mounting fixture for facilitating access to and thereby testing of microwave integrated circuit components operating at multi (tens of) GHz frequencies.

BACKGROUND OF THE INVENTION:

Continuing improvements in circuit design and semiconductor processing methodologies have made it possible to integrate in a monolithic miniaturized packaging scheme substantially all of the circuit elements of which an RF signal processor may be configured. One such packaging technology involves the use of modular plug-in devices, such as the improved TO-style cans described in copending U.S. patent application Ser. No. 888,934, entitled "Plug-in Package for High Speed Microwave Integrated Circuits", filed July 24, 1986 and assigned to the assignee of the present application. Through an improved mounting configuration and conductor/dielectric (pin/glass) interface, an impedance match through the signal transmission path between the MMIC and the external world is maintained, so that the plug-in package may be readily interfaced with miniaturized microwave transmission line structures. One transmission line structure that is particularly useful for interconnecting and providing an integrated support structure for components that operate at such high frequencies (e.g. on the order of 20 GHz or more) is a miniaturized periodic transmission line architecture known as 'waffleline', described in detail in U.S. Pat. No. 4.695,810, issued Sept. 22, 1987 and assigned to the assignee of the present application.

Now, although these packaging and interconnect schemes provide a practical hardware approach to system miniaturization and integration, the extremely close proximity of the pins (e.g. on the order of 100 mils) of the plug-in packages has made access to individual signal conductors for purposes of testing the devices extraordinarily difficult. Moreover, in order to successfully test a device not only is it necessary to isolate each respective pin, but the requisite impedance match through the test path must be maintained.

SUMMARY OF THE INVENTION:

In accordance with the present invention, these problems are overcome by a new and improved test fixture for supporting and providing access to signal conductor pins that extend from a microwave integrated circuit-containing package, such as a micro-miniaturized TO-style can, so as to permit testing of the operation of its internal MMIC. The test fixture is comprised of a conductive alignment plate, a pogo-pin assembly, a transmission line interconnect and support baseplate, and a pressure engagement assembly.

The conductive alignment plate contains a plurality of apertures arranged in a pattern that matches that of the signal conductor pins of the MMIC-containing package to be tested. The diameters of the apertures through the alignment plate are such that, as the package is placed on the alignment plate, its signal conductor pins pass through the apertures and form sections of transmission line with the surrounding conductive material. The apertures are sized such that the impedance of these sections of transmission line effectively matches that (e.g. 50 ohms) of the internal interconnect to the MMICs within the package. A respective one of the apertures through the alignment plate has a wide diameter region which receives a bushing to provide coaxial alignment of a conductor pin of the package within the aperture.

The conductive alignment plate is mounted atop a pogo-pin assembly. The pogo-pin assembly includes a conductive support housing between first and second surfaces of which a plurality of cylindrical bores are formed. The bores are arranged in a pattern that matches that of the signal conductors of the package, and contain sleeves of dielectric material and a plurality of pogo-pins inserted into the dielectric sleeves. The pogo-pins form with the conductive material of the housing respective sections of microwave transmission line having an impedance that effectively matches the impedance of the sections of transmission line through the alignment plate. A portion of each pogo-pin protrudes beyond the second surface of the housing. Each pogo-pin is formed of a conductive tube from a first end of which protrudes a conductive pin that engages one end of an internal spring. A second end of the internal spring engages an axially translatable rod member which extends through the tube. A conductive ring member is affixed to outer surface of the tube, and has a diameter less than the diameter of a cylindrical bore through the pogo-pin housing, so that there is an annular gap between the conductive ring member and the bore. Dielectric sleeves are inserted into opposite ends of each bore so as to abut against the conductive ring member of the pogo-pin that has been inserted into the bore.

The pogo-pin housing is mounted to an underlying support baseplate that contains a transmission line interconnect structure and a pattern of holes which intersect regions of the transmission line interconnect structure, the pattern of holes through the baseplate corresponding to and aligned with the pattern of cylindrical bores through the pogo-pin housing. That portion of a pogo-pin which protrudes beyond the second surface of the housing forms with the baseplate a transmission line which has impedance effectively matching the impedance of a respective section of transmission line through the housing. The transmission line interconnect structure preferably comprises a waffleline structure formed in the lower surface of the baseplate opposite to its upper surface which engages the second surface of the housing. The baseplate further includes a plurality of coaxial connectors that are coupled to spaced apart channels of the waffleline and joined to protruding portions of respective ones of the pogo-pins by way of strands of insulated center conductor that extend through channels of the waffleline.

The pressure engagement assembly is mounted upon the baseplate adjacent to the pogo-pin housing and is positioned to engage a microwave integrated circuit-containing package and to urge the package into pressure contact with the alignment plate, so that, as the package is brought into contact with the alignment plate, its signal conductors are aligned with and pass through the apertures through the plate, and press against the pogo-pins. In one embodiment, the pressure engagement assembly has a rotatable, spring-loaded, axially displaceable cylinder for retaining an MMIC-containing package (TO-style microwave integrated circuit-containing can) at one end and, through displacement and rotation of the cylinder, causes the bottom of the can to be held against the alignment plate by a prescribed spring force. In another embodiment, the pressure-engagement assembly includes a pivotal swing arm mounted to the baseplate, the swing arm having a fitting for capturing a microwave integrated circuit-containing TO-style can, and a latch for securing the pivotal arm in engagement with the baseplate, so that a TO can that has been captured by the fitting is urged into a pressure engagement against the alignment plate.

DETAILED DESCRIPTION

Figure 1:
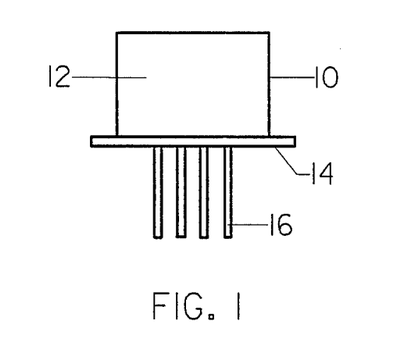
FIGS. 1 and 2 are respective diagrammatic side and top views of an MMIC-containing TO-style can.
Figure 2:
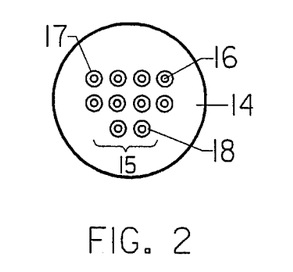

Referring now to FIGS. 1 and 2, diagrammatically shown are respective side and top views of an MMIC-containing package, specifically a TO-style can of the type described in the above-referenced copending application, that is capable of being tested using the fixture according to the present invention. As illustrated, a typical TO can 10 has a generally cylindrical conductive cover 12 affixed to an underlying conductive base or header 14 from the underside of which extends an arrangement 15 of (RF) signal conductor pins 16. Each of pins 16 is supported within an aperture 17 in the base 14 by means of a surrounding dielectric (e.g. glass) seal 18, and is dimensioned with the aperture and dielectric such that the characteristic impedance through the header 14 is on the order of 50 ohms, so as to match the customary 50 ohm impedance of the internal transmission links to the MMIC within the can. At frequencies in the multi-GHz range (e.g. on the order of 10 to 20 GHZ), the extremely close mutual proximity (e.g. 100 mil spacing) of pins 16 makes testing of the MMIC within the can extremely difficult, both in terms of mechanical attachment and signal degradation (the need to maintain an impedance match throughout the signal transmission path).

Figure 3:
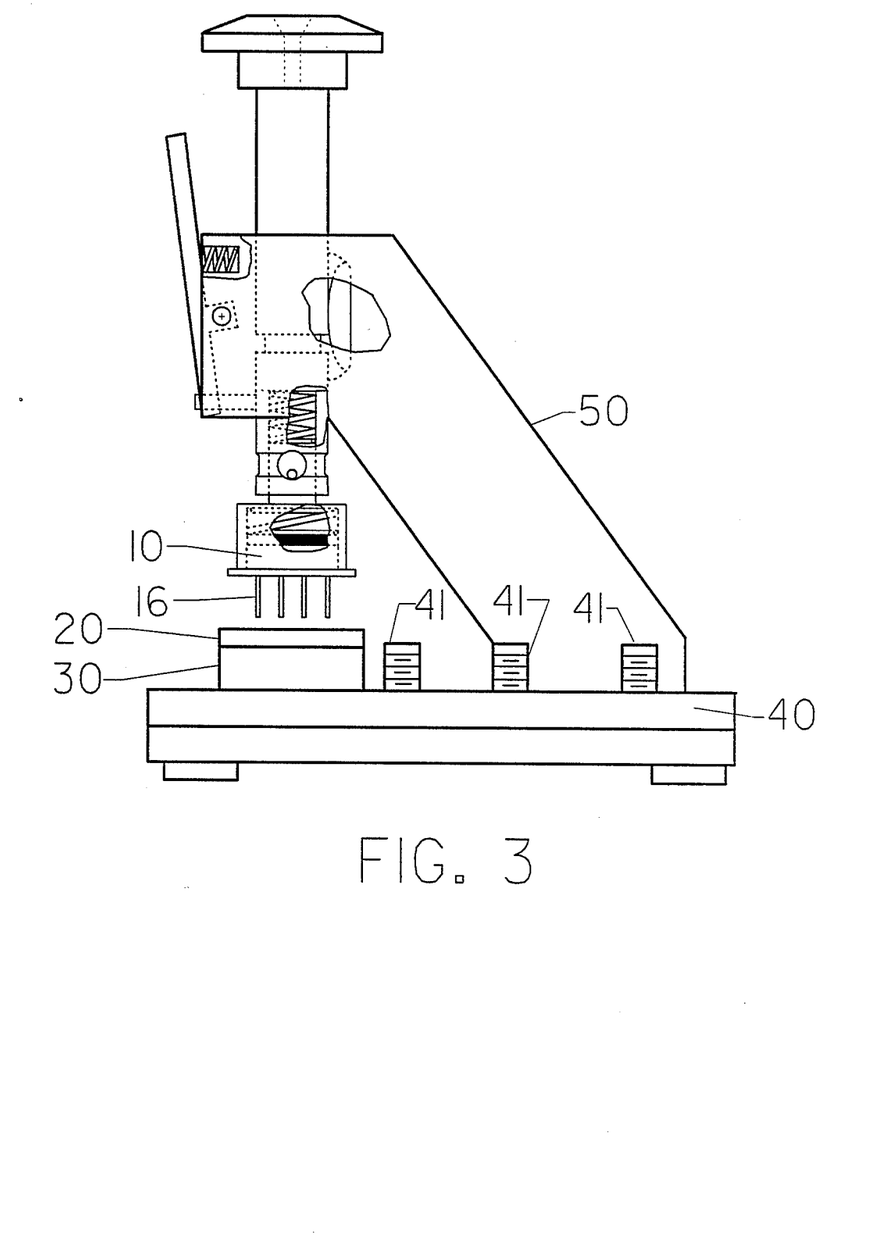
FIG. 3 is a diagrammatic side view of an embodiment of a test fixture for mounting and providing signal access to a TO-style MMIC-containing can.

This problem is effectively solved in accordance with the test fixture of the present invention, a side view of which is diagrammatically illustrated in FIG. 3, through which an individual package (e.g. TO-style can) may be captured and urged into engagement with a microwave transmission line structure that contains mechanically accessible signal coupling ports (e.g. conventional coaxial connectors) so as to facilitate electrical access to the circuitry of the MMIC. More particularly, the test fixture is comprised of a conductive alignment plate 20, through which the pins 16 of the MMIC package pass and engage a plurality of pogo-pins of a pogo-pin assembly 30. Pogo-pin assembly 30, in turn is affixed to an underlying support baseplate 40, which contains a transmission line interconnect structure for providing signal coupling highways between a plurality of coaxial connectors 41 and the pogo-pins of pogo-pin assembly 30. Also supported on baseplate 40 is a pressure engagement assembly 50, which serves to urge a captured MMIC package into secure contact with alignment plate 20 and thereby cause pins 16 to be securely engaged with the pogo-pins of assembly 30, whereby there is a continuous transmission line signal path between each of the signal conductor pins of package 10 and respective coaxial connectors 41.

Figure 4:
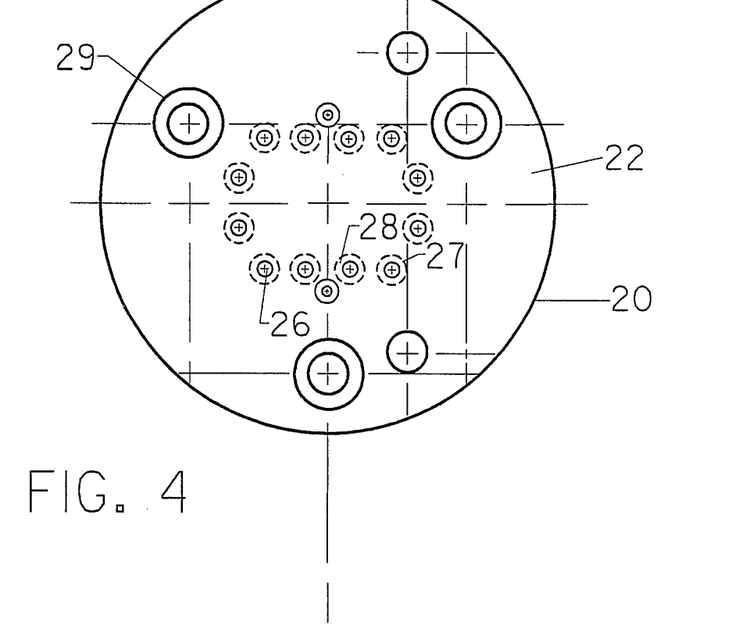
FIGS. 4 and 5 show respective top and side sectional views of an alignment plate.
Figure 5:
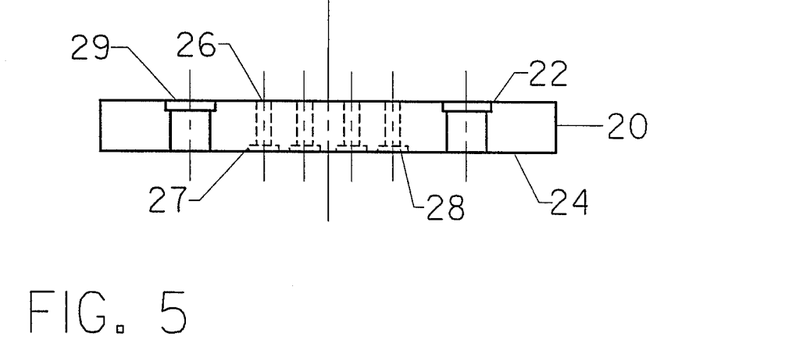

As shown in detail in the respective top and side sectional views of FIGS. 4 and 5, alignment plate 20 is circular metal (e.g. aluminum) disc having a top surface 22 and a bottom surface 24, and contains a plurality of apertures 26 arranged in a pattern that matches that of the signal conductor pins 1 of the MMIC-containing package 10 to be tested. The diameters of apertures 26 through alignment plate 20 are larger than the diameters of pins 16 so as to leave a cylindrical air space surrounding each pin. The size of the air gap is tailored, so that, as package 10 is placed on the alignment plate, a section of coaxial transmission line is formed between each pin 16 and the conductive wall of an aperture 26 through plate 20 and has a characteristic impedance (e.g. 50 ohms) which matches that of the signal transmission links through package 10. The bottom of each aperture 26 has a wide diameter region 27 which receives a dielectric bushing 28 for providing coaxial alignment of pin 16 within the aperture. The wider diameter of dielectric bushing 28 maintains the characteristic impedance at the intended 50 ohms value. Alignment plate 20 also has a plurality of mounting holes 29 for receiving screws for mounting the plate atop pogo-pin assembly 30.

Figure 6:
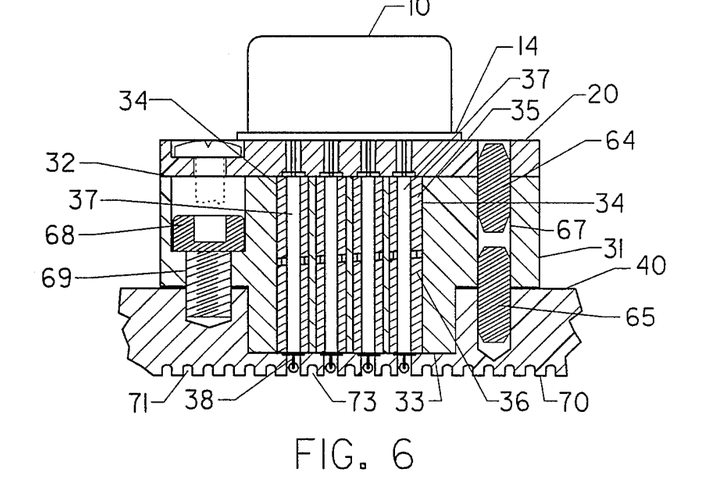
FIGS. 6 and 7 diagrammatically show the details of a pogo-pin assembly.
Figure 7:
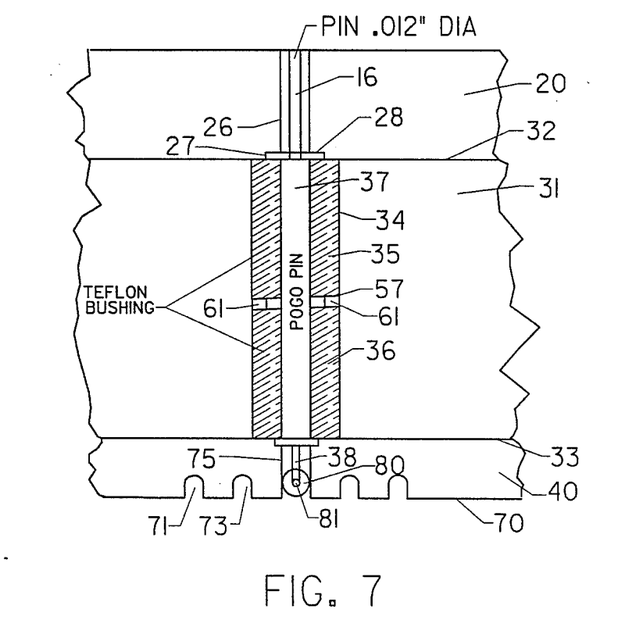

Pogo-pin assembly 30 is diagrammatically shown in FIG. 6 and FIG. 7, which is an enlarged view of a portion of FIG. 6, as comprising a generally cylindrical-T shaped conductive housing block 31 between a top surface 32 and a bottom surface 33 of which a plurality of cylindrical bores 34 are formed. Bores 34 are arranged in a pattern that matches that of signal conductors 16 of package 10, and each contains a pair of sleeves 35 and 36 of dielectric material, through which a pogo-pin 37 (to be described in detail below with reference to FIG. 8) is inserted. Together with the conductive material of housing block 31, pogo-pin 37 forms a section of microwave transmission line having an impedance that effectively matches the impedance of the sections of transmission line through the alignment plate (50 ohms in the present example). A lower end pin portion 38 of each pogo-pin 37 protrudes beyond the bottom surface 33 of housing block 31, so that it may pass through a hole in underlying baseplate 40 and intersect a channel of a waffleline structure formed in the baseplate.

Figure 8:
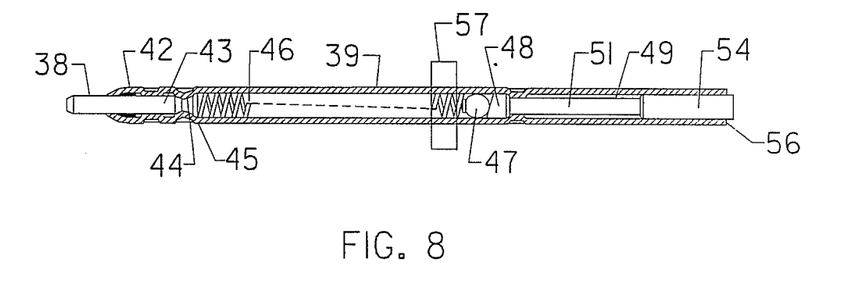
FIG. 8 diagrammatically illustrates the configuration of a respective pogo-pin.

As diagrammatically illustrated in FIG. 8, each pogo-pin 37 is formed of a conductive tube 39 from a first closed end 42 of which protrudes pin portion 38. As noted above, protruding end pin portion 38 is of a length that permits it to pass through a hole in underlying baseplate 40 and intersect a channel of a waffleline structure formed in the baseplate. Pin portion 38 is fixedly retained (e.g. soldered) within closed end 42 of tube 39, so that it is mechanically solid with tube 39 and provides an electrical coupling path to the tube. Abutting against a lip region 44 of closed end 42 of tube 39 is one end 45 of an internal (compression) pogo-spring 46, a second end of which engages a (stainless steel) ball 47 that rides in contact with a head 48 of a plunger rod 49. Plunger rod 49 includes a reduced diameter shaft region 51 that is axially translatable through a conically indented portion 52 of tube 39. Shaft region 51 is solid with a shank portion 54 that extends to the top end 56 of tube 39. The length of shaft region 51 is sufficient to permit plunger rod 49 to be translated axially (to the left as viewed in FIG. 8) and compressing pogo-spring 46 in response to the passage of one of the pins 16 of MMIC package 10 through alignment plate 20 into pressure contact with shank portion 54 of plunger rod 51.

A conductive ring member 57 is affixed to the outer surface of tube 39, and has a diameter less than the diameter of a cylindrical bore 34 through the pogo-pin housing block 31, so that there is an annular gap 61 (FIG. 7) between conductive ring member 57 and the cylindrical wall of bore 34. Dielectric sleeves 35 and 36 are inserted into opposite ends of each bore 34, so as to abut against conductive ring member 57 of the pogo-pin that has been inserted into the bore. With the opposite (outer) surfaces of dielectric sleeves 35 and 36 being retained by alignment plate 20 and baseplate 40, respectively, the pogo-pin is securely captured within the bore. Since ring member 57 is conductive its diameter is less than that of the bore so as to provide an annular air space gap 61 that maintains the requisite 50 ohm transmission line impedance.

With reference again to FIGS. 6 and 7, pogo-pin housing block 31 is mounted (by way of guide dowels 64, 65 through guide bore 67, and a plurality of screws 68 through bores 69) to an underlying support baseplate 40. Formed in the lower surface 70 of baseplate 40 is a transmission line interconnect structure 71, channels 73 of which are intersected by a pattern of holes 75 through the baseplate, the pattern of holes corresponding to and being aligned with the pattern of cylindrical bores through the pogo-pin housing block 31. A hole 75 is sized such that the lower end portion 38 of a pogo-pin, which protrudes beyond the lower surface 33 of housing block 31, forms with the baseplate a transmission line which has impedance effectively matching the impedance of a respective section of pogo-pin transmission line through the housing block (50 ohms).

The transmission line interconnect structure 71 formed in lower surface 70 of baseplate 40 is preferably configured as a (50 ohm) waffleline structure, such as that described in the above-referenced Heckaman et al '810 patent. The length of the protruding end portion 38 of a pogo-pin is such that it terminates substantially midway of a channel 73, so that it effectively abuts against and may be soldered to the center conductor 81 of a strand of insulation clad wire 80 that is installed in the waffleline. Wire 80 extends through on or more of the channels of the waffleline and terminates at one of a plurality of (50 ohm) coaxial connectors 41, which are threaded into tapped bores in baseplate 40 and intersect respective channels 73 of the waffleline structure 71. Consequently, when an MMIC package is installed atop alignment plate 20, a continuous (50 ohm) transmission line path is provided between each coaxial connector 41 and a respective conductor pin 16 of the package, so that signal access and thereby testing of the internal circuitry of the package can be accomplished through conventional coaxial connector ports.

In order to facilitate alignment and secure retention of a respective MMIC package 10 with the test fixture, a pressure engagement assembly 50 is mounted upon baseplate 40 adjacent to pogo-pin housing block 31 and is positioned to engage the package and to urge it into pressure contact with alignment plate 20, so that, as the package is brought into contact with the alignment plate, its conductor pins 16 are aligned with and pass through apertures 26 through the plate, and press against the shank portions 54 of the pogo-pins. In accordance with a first embodiment, illustrated diagrammatically in FIG. 9, the pressure engagement assembly has a rotatable, spring-loaded, axially displaceable plunger ram 91 supported by way of an arm 92 that is fixed to support baseplate 40. The lower end of plunger 91 has a gripping cup 93 for capturing an MMIC-containing package (e.g. TO-style microwave integrated circuit-containing can) 10. Through vertical displacement (in the direction of arrows 94) and rotation of plunger 91 (about its axis 97), gripping cup may be translated with respect to baseplate 50, such that pins 16 of TO can 10, which extend from the bottom of its base 14, may pass through the apertures in alignment plate 20 and into compression contact with the pogo-pins in housing 31. Plunger 91 contains an internal axial spring 101 that imparts a downward bias against the can cover and causes its base to be held against alignment plate 20 by a prescribed spring force.

Figure 9:
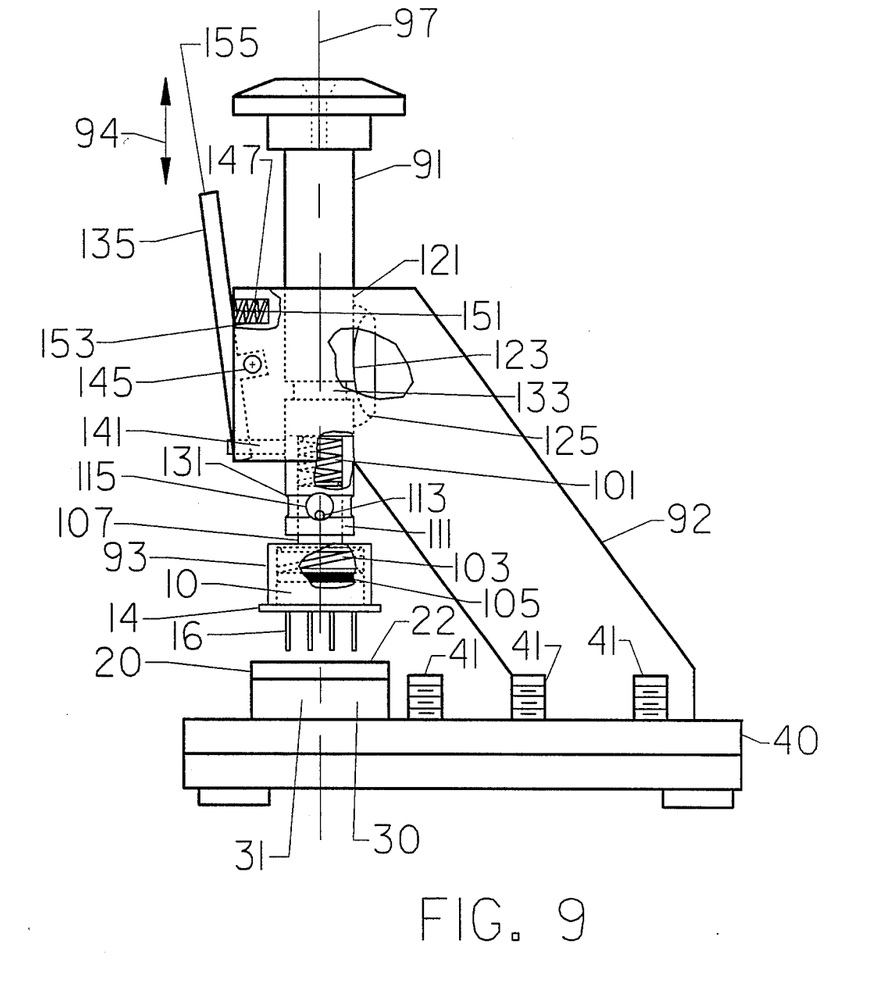
FIG. 9 diagrammatically illustrates a side view of a first embodiment of a pressure engagement assembly.

Mounted to the interior rear surface of gripping cup 93 is an internal spring 103 to which is attached a disc magnet 105 that is sized to engage the top surface of the cover of a TO can to be tested as the can 10 is inserted into cup 93. Cup 93 is solid with a shaft 107 that slideably fits within a lower interior bore 111 of plunger 91 and has a pin 113 that extends through a hole 115 in the cylindrical wall of plunger 91. Hole 115 is sized to permit a slight amount of play of shaft 107 in bore 111. Abutting against the top surface of shaft 107 is the axial spring 101, which serves to bias shaft 107 and thereby gripping cup 93 downwardly.

Ram plunger 91 is vertically slideable within a cylindrical bore 121 in arm 92 against frictional engagement with an internal leaf spring 123 that is retained in a slot 125. Plunger 91 has a pair of annular grooves 131 and 133 that cooperate with a pivotable release arm 135 to fix the vertical position of ram plunger 91 at a pair of spaced apart locations. Specifically, a lower groove 131, which is intersected by hole 115, is engageable by a pin 141 that extends horizontally from a loWer portion of release arm 135. Release arm 135 is retained in arm 92 by means of a pivot pin 145 and has a nose region 147 that is sized to carry a spring 151 that is seated within a side bore 153. Normally, spring 151 biases pin 141 against plunger 91 so that it may be captured by one of grooves 131 and 133 as the plunger is displaced vertically by a cap handle 150 at the top of the plunger. Horizontal pressure against a tab portion 155 of release arm 135 causes the arm to rotate (clockwise as viewed in FIG. 9) about pivot pin 145, so that pin 141 is drawn away from plunger 91 and does not engage either of grooves 131 and 133. Upper groove 133 is located so that, with plunger 91 pushed downwardly, groove 133 engages pin 141 at a point where a TO can 10 captured within gripping cup 93 will abut alignment plate 20. Pin 145 limits the downward translation of shaft 107 and thereby gripping cup 93. The captured TO can is urged down by the bias of spring 103 within cup 91, so that the bottom of the can is flush with alignment plate 20 as its pins 16 push against the pogo-pins within housing block 31. Once a MMIC package (TO can) has been tested (via coax connectors 41), operation of release arm 135 permits plunger 91 to be raised and the captured can removed from gripping cup 93.

Figure 10:
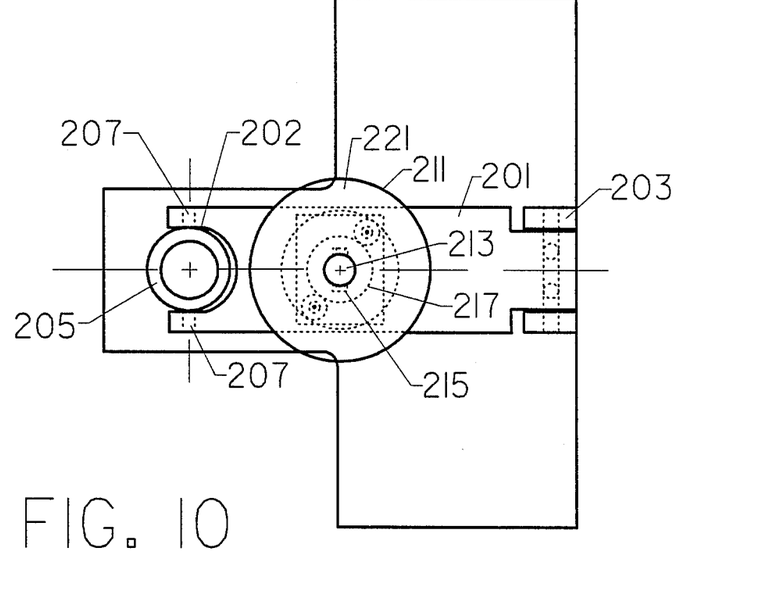
FIGS. 10 and 11 show respective top and side views of a second embodiment of a pressure engagement assembly.
Figure 11:
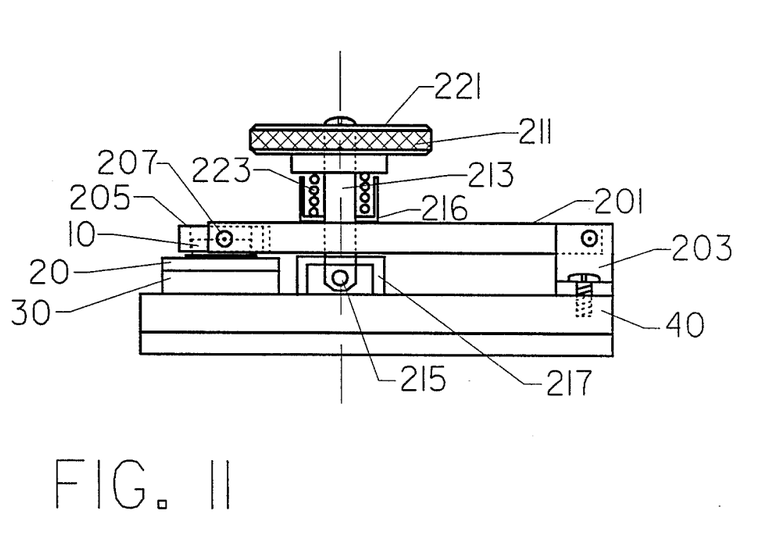

A second embodiment of the pressure engagement assembly is diagrammatically illustrated in the respective top and side views of FIGS. 10 and 11. The assembly comprises a swing arm 201, one end of which is pivotably mounted to a pivot bracket 203 that is secured to baseplate 40. The other end of swing arm arm 201 has a U-shaped opening 202 that is sized to receive a cylindrically shaped gripping ring 205. Ring 205 is mounted to swing arm 201 via pivot pins 207 and is sized to push-capture a MMIC TO-style can 10. A spring loaded, screw-latch mechanism 211 is coupled with swing arm 201. The lower end of its latch shaft 213 has a pin 215 that is insertable into latch cup 217 and retained thereby upon depression and rotation of latch knob 221 against a spring 223, that is retained within a spring cup 216, so that a TO can that has been pushed into or press fit into cup ring 205 may be urged into a pressure engagement against the top of alignment plate 20. After testing, latch knob 221 is again depressed and rotated to release the engagement of the screw-latch mechanism and permit swing arm 201 to be rotated upwardly, so that the tested MMIC package may be removed from gripping ring 205.

As will be appreciated from the foregoing description, the present invention provides an MMIC support assembly that not only facilitates access to the extremely closely spaced signal conductor pins of microminiaturized MMIC packaging devices, but does so by means of in interconnect structure that maintains the necessary impedance match through the signal path and thereby permits direct testing of the devices through readily engageable coaxial connector ports.

While we have shown and described several embodiments in accordance with the present invention, it is to be understood that the same is not limited thereto but is susceptible to numerous changes and modifications as known to a person skilled in the art, and we therefore do not wish to be limited to the details shown and described herein but intend to cover all such changes and modifications as are obvious to one of ordinary skill in the art.

What is claimed:

1. A device for supporting and enabling access to signal conductors of a microwave integrated circuit-containing package, so as to permit testing of the operation of the circuit comprising:

a housing containing conductive material and having a first and second surfaces and through which a plurality of cylindrical bores extend between said first and second surfaces, said bores passing through said conductive material and being arranged in a pattern that matches that of the signal conductors of said package;

sleeves of dielectric material inserted into said plurality of cylindrical bores; and a plurality of pogo-pins inserted into respective ones of said cylindrical bores so as to be surrounded by said sleeves of dielectric material and forming with the conductive material of said housing respective capacitive reactances of sections of microwave transmission line between said first and second surfaces of said housing, such that the impedance thereof effectively matches the impedance through said signal conductors of said package, and further including a plate containing conductive material, said plate having a plurality of apertures through conductive material of said plate, said apertures being arranged in said pattern, and said plate being positioned against said first surface of said housing such that said pattern of apertures therethrough is aligned with the pattern of cylindrical bores through said housing, and wherein the cross section of a respective aperture is larger than that of a conductor of said package, so that when a package is placed on said plate, a respective conductor thereof is surrounded by a dielectric region, as it passes through an aperture to engage a respective one of said pogo pins, and forms a transmission line through said plate having an impedance which effectively matches the impedance of a respective section of transmission line through said housing.

2. A device according to claim 1, wherein said plate is a conductive plate.

3. A device according to claim 1, wherein a respective pogo-pin extends beyond said second surface of said housing, and further including a support baseplate containing a transmission line interconnect structure and a pattern of holes therethrough which intersect regions of said transmission line intersect structure, the pattern of holes through said baseplate corresponding to the pattern of cylindrical bores through said housing, said baseplate engaging said second surface of said housing such that the pattern of holes therethrough is aligned with the pattern of cylindrical bores through said housing, and wherein the cross section of a respective hole through said baseplate is larger than that of the portion of a pogo-pin which extends beyond said second surface of said housing, so that said portion of a pogo-pin is surrounded by a dielectric region as it passes through a hole and intersects said transmission line interconnect structure, and forms a transmission line through said baseplate having an impedance which effectively matches the impedance of a respective section of transmission line through said housing.

4. A device according to claim 3, wherein said transmission line interconnect structure comprises a waffle-line structure formed in surface of said baseplate opposite the surface thereof which engages said second surface of said housing.

5. A device according to claim 4, wherein a respective pogo-pin comprises a conductive tube, from a first end of which a conductive pin, that is mechanically solid with and electrically coupled with said first end of said tube and is sized to pass through a hole in said baseplate into a conductor receiving region of said waffleline structure, said tube further including an internal spring mechanically coupled to a translatable rod member which extends through said tube to a second end thereof, and a conductive ring member affixed to said tube.

6. A device according to claim 5, wherein the diameter of said conductive ring member is less than the diameter of a cylindrical bore through said housing, so that there is an annular gap between said conductive ring member and said bore, and wherein a respective bore is fitted with a pair of sleeves of dielectric material that extend from said first and second surfaces of said housing into said bore and abut against the conductive ring member of the pogo-pin that has been inserted into the bore.

7. A device according to claim 6, wherein a respective one of the apertures through said conductive plate has a wide diameter region which receives a bushing to provide coaxial alignment of a conductor pin of said package within said respective aperture.

8. A device according to claim 4, wherein said baseplate further includes a plurality of coaxial connectors that are coupled to spaced apart channels of said waffle-line and joined to protruding pins of respective ones of said pogo-pins by way of strands of insulated center conductor that extend through channels of said waffle-line.

9. A device according to claim 3, further comprising means, coupled to said support baseplate, for engaging a microwave integrated circuit-containing package and urging said package into contact with said conductive plate, so that, as said package is held against said conductive plate, its signal conductors are aligned with and pass through the apertures through said plate, and press against the pogo-pins of said housing.

10. A device according to claim 9, wherein said means comprises a ram assembly having a rotatable, spring-loaded, axially displaceable cylinder for retaining a microwave integrated circuit-containing package at one end and, through displacement and rotation thereof, for causing said package to be held against said conductive plate by a prescribed spring force.

11. A device according to claim 9, wherein said means comprises a pivotal arm assembly mounted to said baseplate, said arm assembly having a fitting for capturing a microwave integrated circuit-containing package and a clamp for securing said arm in engagement with said baseplate, so that a package captured by said fitting is urged into a pressure engagement against said conductive plate.

12. A device according to claim 1, wherein a respective pogo-pin comprises a conductive tube, protruding from a first end of which is a conductive pin that is mechanically solid with and electrically coupled with said first end of said conductive tube, said conductive pin having a diameter less than that of said conductive tube, said conductive tube containing an internal spring which is mechanically coupled to a translatable rod member which extends through a second end of said conductive tube.

13. A device according to claim 12, wherein said pogo-pin further includes a conductive ring member affixed to said tube.

14. A device according to claim 13, wherein the diameter of said conductive ring member is less than the diameter of a cylindrical bore through said housing, so that there is an annular gap between said conductive ring member and said bore, and wherein a respective bore is fitted with a pair of sleeves of dielectric material that extend from said first and second surfaces of said housing into said bore and abut against the conductive ring member of the pogo-pin that has been inserted into the bore.

15. A device for supporting and enabling access to signal conductors of a microwave integrated circuit-containing package, so as to permit testing of the operation of the circuit comprising:
a housing containing conductive material and having a first and second surfaces and through which a plurality of cylindrical bores extend between said first and second surfaces, said bores passing through said conductive material and being arranged in a pattern that matches that of the signal conductors of said package;
sleeves of dielectric material inserted into said plurality of cylindrical bores; and
a plurality of pogo-pins inserted into respective ones of said cylindrical bores so as to be surrounded by said sleeves of dielectric material and forming with the conductive material of said housing respective capacitive reactances of sections of microwave transmission line between said first and second surfaces of said housing, such that the impedance thereof effectively matches the impedance through said signal conductors of said package, wherein a respective pogo-pin comprises a conductive tube from a first end of which protrudes a conductive pin that is mechanically solid with and electrically coupled with said first end of said tube, said conductive pin having a diameter less than that of said conductive tube, said tube further containing an internal spring which is mechanically coupled to a translatable rod member which extends through said tube to a second end thereof, and a conductive ring member affixed to said tube.

16. A device according to claim 15, wherein the diameter of said conductive ring member is less than the diameter of a cylindrical bore through said housing, so that there is an annular gap between said conductive ring member and said bore, and wherein a respective bore is fitted with a pair of sleeves of dielectric material that extend from said first and second surfaces of said housing into said bore and abut against the conductive ring member of the pogo-pin that has been inserted into the bore.

17. A testing fixture for supporting and providing access to signal conductor pins extending from a microwave integrated circuit-containing package, so as to permit testing of the operation of the circuit comprising:
a conductive alignment plate having a plurality of apertures therethrough, said apertures being arranged in a pattern that matches that of the signal conductor pins of said package, so that said package may be placed upon said alignment plate with said signal conductor pins passing through said apertures and forming therewith a transmission line having an impedance which effectively matches that of the signal conductors within said package;
a pogo-pin assembly including a housing containing conductive material and having a first and second surfaces and through which a plurality of cylindrical bores extend between said first and second surfaces, said bores passing through said conductive material and being arranged in a pattern that matches that of the signal conductors of said package, sleeves of dielectric material inserted into said plurality of cylindrical bores, and a plurality of pogo-pins inserted into respective ones of said cylindrical bores, so as to be surrounded by said sleeves of dielectric material and forming with the conductive material of said housing respective sections of microwave transmission line between said first and second surfaces of said housing, with the impedance thereof effectively matching the impedance of the transmission line through said conductive alignment plate, said pogo-pins extending beyond said second surface of said housing; and
a support baseplate containing a transmission line interconnect structure and a pattern of holes therethrough which intersect regions of said transmission line interconnect structure, the pattern of holes through said baseplate corresponding to the pattern of cylindrical bores through said housing, said baseplate engaging said second surface of said housing such that the pattern of holes therethrough is aligned with the pattern of cylindrical bores through said housing, and wherein the portion of a pogo-pin which extends beyond said second surface of said housing forms a transmission line through said baseplate having an impedance which effectively matches the impedance of a respective section of transmission line through said housing.

18. A device according to claim 17, further comprising means, coupled to said support baseplate, for engaging a microwave integrated circuit-containing package and urging said package into contact with said conductive plate, so that, as said package is held against said conductive plate, its signal conductors are aligned with and pass through the apertures through said plate, and press against the pogo-pins of said housing.

19. A device according to claim 18, wherein said means comprises a ram assembly having a rotatable, spring-loaded, axially displaceable cylinder for retaining a microwave integrated circuit-containing package at one end and, through displacement and rotation thereof, for causing said package to be held against said conductive plate by a prescribed spring force.

20. A device according to claim 18, wherein said means comprises a pivotal arm assembly mounted to said baseplate, said arm assembly having a fitting for capturing a microwave integrated circuit-containing package and a clamp for securing said arm in engagement with said baseplate, so that a package captured by said fitting is urged into a pressure engagement against said conductive plate.

21. A device according to claim 17, wherein said transmission line interconnect structure comprises a waffleline structure formed in a surface of said baseplate opposite the surface thereof which engages said second surface of said housing, and wherein said baseplate further includes a plurality of coaxial connectors that are coupled to spaced apart channels of said waffleline and joined to protruding pins of respective ones of said pogo-pins by way of strands of insulated center conductor that extend through channels of said waffleline.

22. A device according to claim 21, wherein a respective pogo-pin comprises a conductive tube from a first end of which protrudes a conductive pin that is mechanically solid with and electrically coupled with said first end of said tube, said tube further containing an internal spring which is mechanically coupled to a translatable rod member which extends through said tube to a second end thereof, and a conductive ring member affixed to said tube, and wherein the diameter of said conductive ring member is less than the diameter of a cylindrical bore through said housing, so that there is an annular gap between said conductive ring member and said bore, and wherein a respective bore is fitted with a pair of sleeves of dielectric material that extend from said first and second surfaces of said housing into said bore and abut against the conductive ring member of the pogo-pin that has been inserted into the bore.

23. A device according to claim 22, wherein a respective one of the apertures through said conductive plate has a wide diameter region which receives a bushing to provide coaxial alignment of a conductor pin of said package within said respective aperture.

24. A pogo-pin for use with a multi-GHz signal coupling device comprising a conductive tube, protruding from a first end of which is a conductive pin that is mechanically solid with and electrically coupled with said first end of said conductive tube, said conductive pin having a diameter less than that of said conductive tube, said conductive tube containing an internal spring which is mechanically coupled to a translatable rod member which extends through a second end of said conductive tube and further including a conductive ring member affixed to said tube.

* * * * *

UNITED STATES PATENT AND TRADEMARK OFFICE
CERTIFICATE OF CORRECTION

PATENT NO. : 4,947,111
DATED : August 7, 1990
INVENTOR(S) : Roger H. Higman et al It is certified that error appears in the above-identified patent and that said Letters Patent is hereby corrected as shown below:

In column 1, between lines 3 and 8,
the following paragraph should be inserted.

--The United States Government has rights in the present patent under U.S. Government Contract No. MS55338-09.--

Signed and Sealed this

Nineteenth Day of May, 1992

*Attest:*

DOUGLAS B. COMER

*Attesting Officer*      *Acting Commissioner of Patents and Trademarks*